VOLTAGE STABILIZATION CIRCUIT

INVENTOR
HANS KELLER

BY [signature]
ATTORNEY

Aug. 4, 1970 H. KELLER 3,523,198

VOLTAGE STABILIZATION CIRCUIT

Filed Nov. 16, 1967 2 Sheets-Sheet 2

INVENTOR
HANS KELLER

BY [signature]
ATTORNEY 3,523,198
Patented Aug. 4, 1970

3,523,198

VOLTAGE STABILIZATION CIRCUIT

Hans Keller, Freiburg, Germany, assignor to International Standard Electric Corporation, New York, N.Y., a corporation of Delaware Filed Nov. 16, 1967, Ser. No. 683,678
Claims priority, application Germany, Nov. 23, 1966, D 51,615
Int. Cl. H03k *1/12*
U.S. Cl. 307—297 7 Claims

ABSTRACT OF THE DISCLOSURE

A circuit which simulates an adjustable Zener diode. A standard Zener diode when connected according to the invention with a pair of transistors and a pair of resistors, the latter being arranged as an ohmic voltage divider, can be set to provide any desired voltage breakdown point within wide ranges, thereby eliminating the need for selecting particular Zener diodes for specific applications.

BACKGROUND OF THE INVENTION

This invention relates to circuit arrangements for effecting the stabilization of DC voltages, and more particularly to circuits for simulating an adjustable Zener diode.

Zener diodes are very useful circuit components for voltage stabilization. However, limitations in the normal operating characteristics of Zener diodes have heretofore seriously limited their use. For example, conventional Zener diodes are not adjustable for adjustment of the stabilized voltage, and this has in the past made it necessary to manufacture a large number of individual Zener diodes with different breakdown voltages. Also, in the past it has not been possible to use Zener diodes in a range above 10 volts in their reverse breakdown region.

SUMMARY OF THE INVENTION

It is accordingly an object of the present invention to provide a circuit arrangement for effecting the stabilization of DC voltages which has characteristics generally similar to those of a Zener diode, yet which can be used like a Zener diode operated in the breakdown region in a range above 10 volts.

Another object of the invention is to provide a circuit arrangement for stabilizing DC voltages which simulates a Zener diode, yet which is adjustable to provide any desired voltage breakdown point within a wide range, thereby eliminating the need for selecting particular Zener diodes of different breakdown voltages for various applications.

Another object of the invention is to provide a circuit arrangement of the character described which simulates a Zener diode that is adjustable over a wide range of breakdown voltages, which in the breakdown region has a low differential resistance in the same order of magnitude as an individual Zener diode of the corresponding breakdown voltage, and a lower temperature coefficient $TK_u$ of the breakdown voltage.

According to the invention the circuit arrangement comprises two external connecting terminals, at least two transistors operated as amplifiers, at least one semiconductor component with a characteristic range of low differential resistance, and a voltage divider connected between the two connecting terminals. The collectors of the transistors are connected to one of the two connecting terminals, and between the tapping point of the voltage divider and the other connecting terminal there is arranged a serious connection of the base-emitter sections of the transistors in arbitrary order of succession, and of the semiconductor component.

The invention will no be described with reference to three embodiments which are shown in the accompanying drawings, in which:

DETAILED DESCRIPTION

Figure 1:
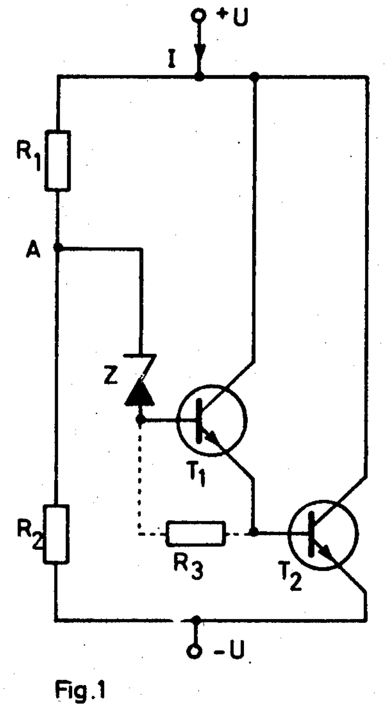
FIG. 1 is a circuit diagram illustrating a first embodiment of the invention.
Figure 2:
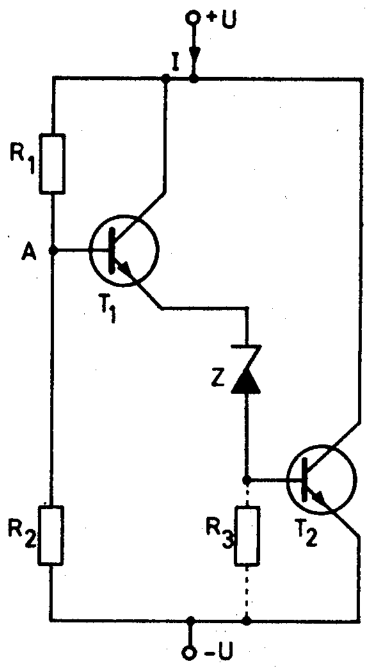
FIG. 2 is a circuit diagram illustrating a second embodiment of the invention.
Figure 3:
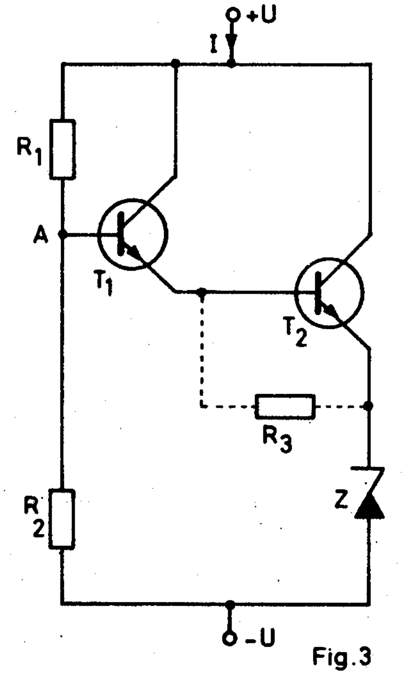
FIG. 3 is a circuit diagram illustrating a third embodiment of the invention.

The circuit arrangements as shown in FIGS. 1 to 3 each contain two resistors $R_1$, $R_2$, one Zener diode Z, and two transistors $T_1$, $T_2$ operating as amplifiers. The Zener diode Z is, in each of the three circuits, connected in series with the base-emitter sections of the two transistors. The collector electrodes of the transistors are connected to one connecting terminal +U of the circuit arrangement. Between the two connecting terminals +U and −U there is arranged a voltage divider $R_1$, $R_2$, the resistance ratio of which is determinative of the magnitude of the stabilized voltage. When appropriately designing this voltage divider to be adjustable, it may be used for varying the voltage at the terminals of the circuit within wide limits, e.g, between 10 volts and 50 volts. In the course of this the temperature coefficient $TK_u$ of the circuit arrangement is not changed, but the differential resistance of the circuit arrangement increases just like in the case of Zener diodes, as the voltage increases.

The mode of operation of the circuit arrangements shown in the accompanying drawings will now be explained in detail with reference to FIG. 1. In the case of a small current J between the terminals +U and −U of the circuit arrangement, this current will first of all only flow across the voltage divider composed of the voltage dividing resistors $R_1$ and $R_2$. An additional current will only flow via the Zener diode into the base electrode of the transistor $T_1$ if the current J is increased to such an extent that the voltage drop at the tapping point A of the voltage divider reaches the sum of the Zener voltage of the diode Z and of the base-emitter threshold voltages of the transistors $T_1$, $T_2$. This current produces a collector current in the transistor $T_2$ which is higher by the product of the static current amplification factors $B_1$. $B_2$ of the two transistors. Any further increase of the current between the connecting terminals of the circuit arrangement is then absorbed by the two transistors. The current flowing through the voltage divider and, consequently, the voltage U as applied to the connecting terminals, however, will remain practically constant.

The circuit arrangements as shown in FIGS. 2 and 3 operate on the same principle. The differential resistance of the circuit arrangements is substantially determined by the emitter currents of the transistors and by the properties of the Zener diode.

It may be advantageous to employ, instead of the Zener diode Z, a series connection of a Zener diode with one or more diodes operated in the forward direction, or another semiconductor component which, within a part of its characteristic, comprises a range with a lower differential resistance. Thus, for example, also the collector-base, the collector-emitter, or the base-emitter breakdown voltage of a normally or inversely operated transistor can be utilized. In any case it is appropriate to select the semiconductor component in such a way that its temperature dependence is compensated by the opposite temperature dependence of the transistors.

Instead of the two transistor amplifiers which are at least required, it is also possible to employ further transistors in a Darlington-circuit, in order to increase the amplification.

With respect to the circuit according to FIG. 2, it is of advantage to dimension the transistor $T_2$ in such a way that its dynamic current amplification factor $$\beta_2 = dJ_c/dJ_b$$

is at least twice as high as its static current amplification factor $\beta_2 = J_c/J_b$ with $J_b$ being the base direct current and $J_c$ being the collector direct current. In addition thereto, it may be appropriate to bridge the base-emitter section of the transistor $T_2$ with the aid of an additional resistor $R_3$.

Figure 4:
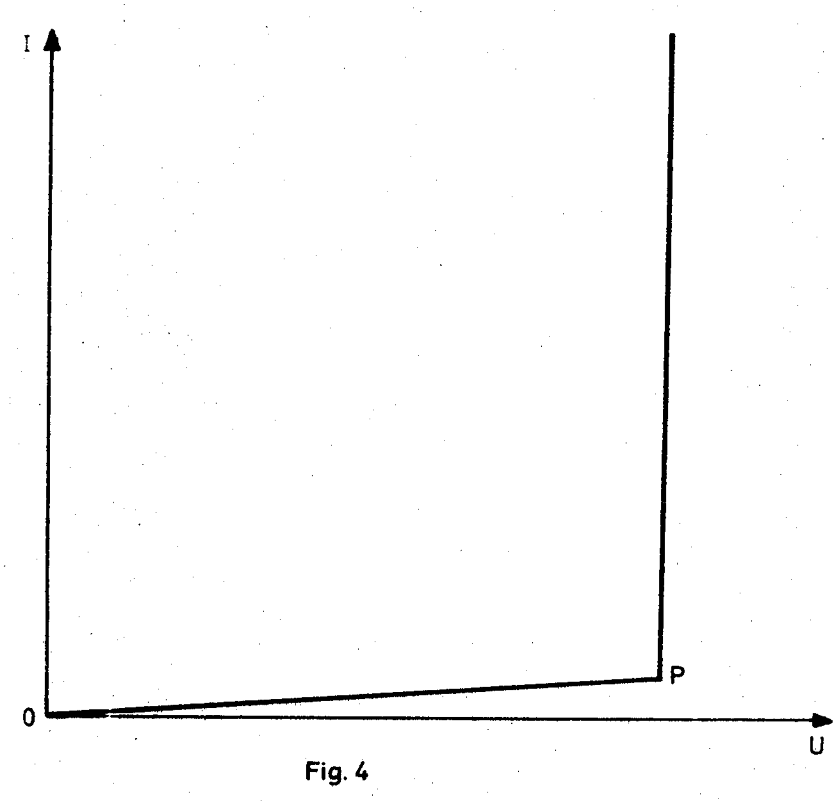
FIG. 4 is a graph illustrating the current-voltage characteristic of a circuit arrangement according to the invention.

In FIG. 4 the current-voltage characteristic of circuit arrangements according to the present invention is plotted. In this graph the rising straight line curve O–P corresponds to the total resistance of the voltage divider, hence to the sum $R_1 + R_2$. The line extending almost vertically in the upward direction at the point P represents the actual stabilization characteristic, i.e., along this line the voltage U of the inventive circuit arrangement is constant and independent of the current J. If the voltage divider $R_1$, $R_2$ is constituted by a sliding resistance with a tapping point (potentiometer), then the total resistance is constant, the two parts of the sliding resistance then representing the resistors $R_1$ and $R_2$.

By changing the position of the sliding resistor, point P will move along the straight line O–P.

If, on the other hand, the position of point P is varied in that the resistor $R_2$ is a fixed resistance, and the resistor $R_1$ is varied, then the pitch of the straight line O–P will change, because point P displaces itself parallel in relation to the U-axis. The pitch of the straight line O–P may be kept small by appropriately choosing the resistor $R_2$ to have a resistance value greater than 5 kilohms.

Measuring results

In a circuit arrangement according to FIG. 3 which contained a Zener diode with a breakdown voltage of 7 volts, a stabilized voltage $U=30$ volts was adjusted by varying the resistance of $R_1$ at a fixed resistor $R_2=20$ kilohms, and at a current $J=5$ ma. The differential resistance of the circuit arrangement as measured between the terminals +U, −U, amounted to 45 ohms, whereas the temperature coefficient $TK_u$ of the circuit arrangement was smaller than $10^{-4}/°$ C. In distinction thereto, the values in the case of a commercially available Zener diode with a breakdown voltage of 30 volts (ZF 30) lie at 35 ohms differential resistance, and $9.10^{-4}/°$ C. temperature coefficient, measured with the same current of 5 ma.

The advantage of the inventive type of circuit arrangement, when compared with an individual Zener diode, thus resides in the fact that the differential resistance lies in the same order of magnitude, whereas the temperature coefficient is improved by a factor of 10, and in that the stabilized voltage can be adjusted within wide limits.

Since, in the most simple case, all three circuit arrangements, with the exception of the voltage divider, only contain semiconductor components or devices, the circuit arrangement is particularly suitable for being built up as an integrated semiconductor circuit within a semiconductor body. Appropriately, either the entire circuit can be integrated as a two-polar unit, or else, in modification, the semiconductor components only may be integrated as a three-polar unit by omitting the voltage divider. In the latter case, the integrated circuit has the properties or characteristics of a Zener diode comprising an additional control electrode for adjusting its breakdown voltage.

From this there results the further advantage that it is no longer necessary to manufacture a whole number of individual Zener diodes with different breakdown voltages. In fact, one single component can be manufactured wherein the stabilizing voltage is adjusted by the user himself.

While the instant invention has been shown and described herein in what are conceived to be the most practical and preferred embodiments, it is recognized that departures may be made therefrom within the scope of the invention, which is therefore not to be limited to details disclosed herein, but is to be accorded the full scope of the claims so as to embrace any and all equivalent devices.

What is claimed is:

1. A voltage stabilization circuit comprising: a pair of terminals for connection to a direct current source of potential; first and second transistors of the same conductivity type, each transistor having a base, a collector, and an emitter, both collectors of said transistors being connected directly to one of said terminals; a voltage divider connected directly between said terminals, said voltage divider having an intermediate tap; first means connecting said tap to the base of said first transistor; second means connecting said first transistor emitter to said second transistor base; and third means connecting said second transistor emitter directly to the other terminal, one of said means including a series, Zener-connected diode.

2. The invention as defined in claim 1, wherein said first means includes said diode.

3. The invention as defined in claim 2, wherein a resistor is connected between said transistor bases.

4. The invention as defined in claim 1, wherein said second means includes said diode.

5. The invention as defined in claim 4, wherein a resistor is connected between said second transistor base and said other terminal.

6. The invention as defined in claim 1, wherein said third means includes said diode.

7. The invention as defined in claim 6, wherein a resistor is connected between said transistor emitters.

References Cited

UNITED STATES PATENTS

| | | | |
|---|---|---|---|
| 2,850,694 | 9/1958 | Hamilton | 307—318 X |
| 3,158,800 | 11/1964 | McPherson | 302—297 X |
| 3,182,246 | 5/1965 | Lloyd | 307—297 X |
| 3,286,200 | 11/1966 | Foulger | 307—315 X |
| 3,303,413 | 2/1967 | Warner et al. | 307—297 X |

JOHN S. HEYMAN, Primary Examiner

U.S. Cl. X.R.

307—237, 318